(12) United States Patent
Tois et al.

(10) Patent No.: US 12,476,106 B2
(45) Date of Patent: Nov. 18, 2025

(54) SELECTIVE DEPOSITION OF ORGANIC MATERIAL

(71) Applicant: ASM IP Holding, B.V., Almere (NL)

(72) Inventors: Eva Tois, Espoo (FI); Daniele Chiappe, Espoo (FI); Marko Tuominen, Helsinki (FI); Viraj Madhiwala, Helsinki (FI); Charles Dezelah, Helsinki (FI); YongGyu Han, Seoul (KR); Anirudhan Chandrasekaran, Scottsdale, AZ (US); Shaoren Deng, Ghent (BE)

(73) Assignee: ASM IP Holding B.V., Almere (NL)

( * ) Notice: Subject to any disclaimer, the term of this patent is extended or adjusted under 35 U.S.C. 154(b) by 427 days.

(21) Appl. No.: 17/936,607

(22) Filed: Sep. 29, 2022

(65) Prior Publication Data
US 2023/0098114 A1 Mar. 30, 2023

Related U.S. Application Data

(60) Provisional application No. 63/250,298, filed on Sep. 30, 2021.

(51) Int. Cl.
*H01L 21/02* (2006.01)
*H01L 21/311* (2006.01)

(52) U.S. Cl.
CPC .... *H01L 21/0228* (2013.01); *H01L 21/02118* (2013.01); *H01L 21/02205* (2013.01)

(58) Field of Classification Search
None
See application file for complete search history.

(56) References Cited

U.S. PATENT DOCUMENTS

| | | | |
|---|---|---|---|
| 8,415,812 B2 | 4/2013 | Dershem |
| 8,956,971 B2 | 2/2015 | Haukka |
| 9,257,303 B2 | 2/2016 | Haukka |
| 9,679,808 B2 | 6/2017 | Haukka |
| 9,895,715 B2 | 2/2018 | Haukka |
| 10,049,924 B2 | 8/2018 | Haukka |
| 10,177,025 B2 | 1/2019 | Pore |
| 10,343,186 B2 | 7/2019 | Pore |
| 10,373,820 B2 | 8/2019 | Tois |

(Continued)

FOREIGN PATENT DOCUMENTS

| | | |
|---|---|---|
| CN | 110651064 A | 1/2020 |
| CN | 113471059 A | 10/2021 |
| WO | 2021025874 A1 | 2/2021 |

*Primary Examiner* — Asok K Sarkar
(74) *Attorney, Agent, or Firm* — Banner & Witcoff, Ltd.

(57) ABSTRACT

The present disclosure relates to methods and apparatuses for the manufacture of semiconductor devices. More particularly, the disclosure relates to methods and apparatuses for depositing an organic layer selectively on a substrate comprising at least two different surfaces. The process comprises providing a substrate in a reaction chamber, providing a first vapor-phase precursor in the reaction chamber, and providing a second vapor-phase precursor in the reaction chamber. In the method, the first and second vapor-phase precursors form the organic material selectively on the first surface relative to the second surface, and the first vapor-phase precursor comprises a diamine compound comprising at least five carbon atoms and the amine groups being attached to non-adjacent carbon atoms.

21 Claims, 4 Drawing Sheets

(56) References Cited

U.S. PATENT DOCUMENTS

| | | |
|---|---|---|
| 10,453,701 B2 | 10/2019 | Tois |
| 10,456,808 B2 | 10/2019 | Haukka |
| 10,695,794 B2 | 6/2020 | Pore |
| 10,814,349 B2 | 10/2020 | Pore |
| 10,854,460 B2 | 12/2020 | Tois |
| 10,923,361 B2 | 2/2021 | Tois |
| 11,081,342 B2 | 8/2021 | Färm |
| 11,094,535 B2 | 8/2021 | Tois |
| 11,145,506 B2 | 10/2021 | Maes |
| 11,213,853 B2 | 1/2022 | Haukka |
| 11,387,107 B2 | 7/2022 | Tois |
| 11,389,824 B2 | 7/2022 | Pore |
| 11,450,529 B2 | 9/2022 | Longrie |
| 11,535,710 B2 | 12/2022 | Alidedeoglu |
| 11,694,903 B2 | 7/2023 | Ritala et al. |
| 2003/0021895 A1 | 1/2003 | Ramm |
| 2015/0217330 A1 | 8/2015 | Haukka et al. |
| 2017/0352533 A1* | 12/2017 | Tois ................. B05D 1/60 |
| 2018/0033679 A1 | 2/2018 | Pore |
| 2019/0148128 A1 | 5/2019 | Smith et al. |
| 2020/0066512 A1 | 2/2020 | Tois et al. |
| 2020/0105515 A1 | 4/2020 | Maes et al. |
| 2020/0324316 A1 | 10/2020 | Pore |
| 2020/0328078 A1 | 10/2020 | Tapily |
| 2020/0354834 A1 | 11/2020 | De Silva et al. |
| 2021/0115559 A1 | 4/2021 | Sharma et al. |
| 2021/0175092 A1 | 6/2021 | Tois |
| 2021/0301391 A1 | 9/2021 | Givens |
| 2021/0351031 A1 | 11/2021 | Färm |
| 2021/0358739 A1 | 11/2021 | Tois |
| 2021/0358745 A1 | 11/2021 | Maes |
| 2022/0068634 A1 | 3/2022 | Deng |
| 2022/0084817 A1 | 3/2022 | Sharma et al. |
| 2022/0181163 A1 | 6/2022 | Illiberi |
| 2022/0193720 A1 | 6/2022 | Haukka |
| 2022/0208542 A1 | 6/2022 | Maes |
| 2022/0367185 A1 | 11/2022 | Longrie et al. |
| 2023/0140367 A1 | 5/2023 | Madhiwala et al. |
| 2023/0178371 A1 | 6/2023 | Deng et al. |
| 2023/0227965 A1 | 7/2023 | Deng et al. |
| 2025/0069883 A1 | 2/2025 | Vandalon et al. |

* cited by examiner

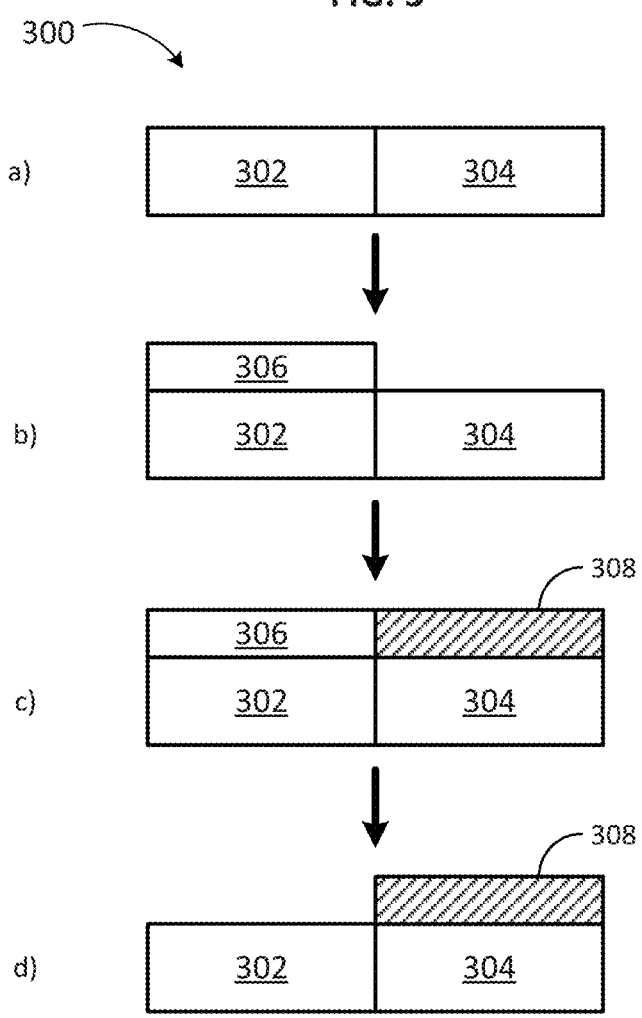

SELECTIVE DEPOSITION OF ORGANIC MATERIAL

FIELD

The present disclosure relates to methods and apparatuses for the manufacture of semiconductor devices. More particularly, the disclosure relates to methods and apparatuses for depositing an organic layer selectively on a substrate comprising at least two different surfaces.

BACKGROUND

Semiconductor device fabrication processes generally use advanced deposition methods. Patterning is conventionally used in depositing different materials on semiconductor substrates. Selective deposition, which is receiving increasing interest among semiconductor manufacturers, could enable a decrease in steps needed for conventional patterning, reducing the cost of processing. Selective deposition could also allow enhanced scaling in narrow structures. Various alternatives for bringing about selective deposition have been proposed, and additional improvements are needed to expand the use of selective deposition in industrial-scale device manufacturing.

Organic polymer layers can be used, for example, as a starting point in semiconductor applications for amorphous carbon films or layers. As an example, polyimide-containing layers are valuable for their thermal stability and resistance to mechanical stress and chemicals, and they have been described as passivation layers to allow selective deposition of different materials. Vapor-phase deposition processes such as chemical vapor deposition (CVD), vapor deposition polymerization (VDP), molecular layer deposition (MLD), and sequential deposition processes such as atomic layer deposition (ALD) and cyclical CVD may be used to deposit organic polymer layers. In such processes, the precursors used to deposit the material have an important role in the properties of the deposited layers. This, again, affects the material's usability when different materials are selectively deposited on different surface combinations.

In addition to the properties of the organic material, precursors differ in their physical properties, affecting the ease of handling of the precursors, as well as the possible parameter range during deposition. Thus, a need exists in the art to broaden the selection of precursors for the deposition of organic polymer layers.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing organic material on a substrate, to an organic layer, and to deposition assemblies for depositing organic material on a substrate.

In one aspect, a method for selectively depositing a layer of organic material on a substrate comprising a first surface and a second surface by a cyclic deposition process is disclosed. The process comprises providing a substrate in a reaction chamber, providing a first vapor-phase precursor in the reaction chamber, and providing a second vapor-phase precursor in the reaction chamber. I the method, the first and second vapor-phase precursors form the organic material selectively on the first surface relative to the second surface, and the first vapor-phase precursor comprises a diamine compound comprising at least five carbon atoms and the amine groups being attached to non-adjacent carbon atoms, and the first precursor is liquid at a temperature of 15-40° C.

In some embodiments, the temperature at which the vapor pressure of the first precursor is 1 Torr is lower than 40° C., or lower than 20° C.

In some embodiments, the second vapor-phase precursor comprises a dianhydride. In some embodiments, the organic material comprises a polyimide. In some embodiments, the organic material comprises a polyamic acid. In some embodiments, the substrate is held at a temperature higher than about 100° C. during the deposition process.

In some embodiments, the second surface comprises an inorganic dielectric surface. In some embodiments, the second surface is an inorganic dielectric surface. In some embodiments, the second surface comprises silicon. In some embodiments, the second surface comprises $SiO_2$.

In some embodiments, the organic material is deposited on the first surface relative to the second surface with a selectivity of above about 50%.

In some embodiments, the first surface comprises a metal oxide, elemental metal, or metallic surface. In some embodiments, the first surface comprises a metal selected from a group consisting of aluminum, copper, tungsten, cobalt, nickel, niobium, iron, molybdenum, manganese, zinc, ruthenium and vanadium.

In some embodiments, each deposition cycle further comprises removing excess of the first vapor-phase precursor and reaction by-products after providing the first vapor-phase precursor into the reaction chamber. In some embodiments, each deposition cycle further comprises removing excess of the second vapor-phase precursor and reaction by-products after providing the second vapor-phase precursor into the reaction chamber.

In some embodiments, the diamine compound is a C5 to C11 compound. In some embodiments, a carbon atom bonded with an amine nitrogen in the diamine compound is bonded to at least two carbon atoms. In some embodiments, the diamine is selected from a group consisting of 1,3-diaminopentane, 1,4-diaminopentane, 2,4-diaminopentane, 2,4-diamino-2,4-dimethylpentane, 1,5-diamino-2-methylpentane, 1,3-diaminobutane, 1,3-diamino-3-methylbutane, 2,5-diamino-2,5-dimethylhexane, 1,4-diamino-4-methylpentane, 1,3-diaminobutane, 1,5-diaminohexane, 1,3-diaminohexane, 2,5-diaminohexane, 1,3-diamino-5-methylhexane, 4,4,4-trifluoro-1,3-diamino-3-methylbutane, 2,4-diamino methylpentane, and 4-(1-methylethyl)-1,5-diaminohexane, 3-amino-1-butanamide, 1,3-diamino-2-ethylhexane, 2,7-diamino-2,7-dimethyloctane and 1,3-diaminobenzene and 1,4-diaminobenzene. In some embodiments, the diamine compound comprises a halogen. In some embodiments, the diamine compound is not 1,5-diaminopentane. In some embodiments, the diamine is not 2,2,-dimethyl-1,3-propanediamine. In some embodiments, the diamine compound is not 1,5-diaminopentane and is not 2,2,-dimethyl-1,3-propanediamine.

In some embodiments, the method further comprises subjecting the substrate to an etch process subsequent to multiple consecutive deposition cycles, wherein the etch process removes substantially all of any deposited organic material from the second surface of the substrate and does not remove substantially all of the deposited organic material from the first surface of the substrate. In some embodiments, the etch process comprises exposing the substrate to hydrogen atoms, hydrogen radicals, hydrogen plasma, or combinations thereof. In some embodiments, the etch process comprises exposing the substrate to oxygen atoms, oxygen radicals, oxygen plasma, or combinations thereof.

In one aspect, a method for selectively depositing a layer of organic material on a substrate comprising a first surface and a second surface by a cyclic deposition process is disclosed. In this aspect, the process comprises contacting the substrate with a first vapor-phase precursor, and contacting the substrate with a second vapor-phase precursor, wherein the first and second vapor-phase precursors form the organic material selectively on the first surface relative to the second surface, and wherein the first vapor-phase precursor comprises a diamine comprising at least three carbon atoms and the amine groups being attached to non-adjacent carbon atoms, and wherein the first precursor is liquid at a temperature of 15-40° C.

In another aspect, a method of selectively depositing an inorganic material on a second surface of a substrate relative to first a surface of the substrate by a cyclic deposition process is disclosed. In this aspect, the process comprises depositing a layer of organic material on the first surface by providing a substrate in a reaction chamber, providing a first vapor-phase precursor in the reaction chamber, and providing a second vapor-phase precursor in the reaction chamber and depositing the inorganic material on the second surface. The first and second vapor-phase precursors form the organic material selectively on the first surface relative to the second surface, the first vapor-phase precursor comprises a diamine compound comprising at least five carbon atoms, the amine groups are attached to non-adjacent carbon atoms, and the first precursor is liquid at a temperature of 15-40° C.

In yet another aspect, an organic material layer produced by a cyclic deposition process is disclosed. In this aspect, the process comprises providing a substrate in a reaction chamber, providing a first vapor-phase precursor in the reaction chamber, and providing a second vapor-phase precursor in the reaction chamber. The first and second vapor-phase precursors form the organic material selectively on the first surface relative to the second surface, and the first vapor-phase precursor comprises a diamine compound comprising at least five carbon atoms and the amine groups are attached to non-adjacent carbon atoms, and the first precursor is liquid at a temperature of 15-40° C.

In a further aspect, a deposition assembly for selectively depositing a layer of organic material on a substrate is disclosed. The deposition assembly comprises one or more reaction chambers constructed and arranged to hold the substrate, and a precursor injector system constructed and arranged to provide a first precursor and a second precursor into the reaction chamber in a vapor phase. The deposition assembly also comprises a precursor vessel constructed and arranged to contain a first precursor, and the assembly is constructed and arranged to provide the first precursor and the second precursor via the precursor injector system to the reaction chamber to deposit a layer of organic material on the substrate. The first precursor comprises a diamine compound comprising at least five carbon atoms, the amine groups are attached to non-adjacent carbon atoms, and the first precursor is liquid at a temperature of 15-40° C.

As used herein, the term "substrate" may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group III-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers. A substrate according to the current disclosure comprises two surfaces having different material properties.

As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

In this disclosure, "gas" can include material that is a gas at normal temperature and pressure (NTP), a vaporized solid and/or a vaporized liquid, and can be constituted by a single gas or a mixture of gases, depending on the context. Precursors according to the current disclosure may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

In some embodiments, a precursor is provided in a mixture of two or more compounds. In a mixture, the other compounds in addition to the precursor may be inert compounds or elements. In some embodiments, a precursor is provided in a composition. Compositions suitable for use as composition can include Composition may be a solution or a gas in standard conditions.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

FIG. 3 is a schematic presentation of depositing an organic layer according to the current disclosure on a metal surface relative to a dielectric surface of a substrate.

DETAILED DESCRIPTION

Figure 1A:
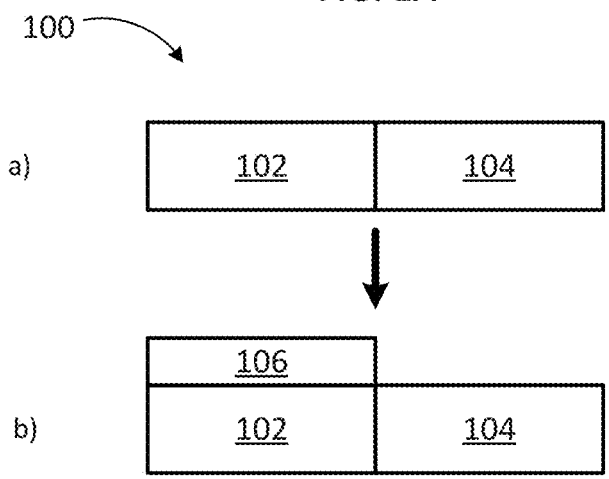
FIGS. 1A to 1C, illustrate selective deposition according to the current disclosure.

The description of exemplary embodiments of methods, layers and deposition assemblies provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other. The headings provided herein, if any, are for convenience only and do not necessarily affect the scope or meaning of the claimed invention.

Surfaces

According to some aspects of the present disclosure, selective deposition can be used to deposit an organic material on a first surface relative to a second surface. The two surfaces can have different material properties. In some embodiments, an organic material is selectively deposited on a first conductive (e.g., metal or metallic) surface of a substrate relative to a second dielectric surface of the substrate. In some embodiments, the second surface comprises hydroxyl (—OH) groups, such as a silicon oxide-based surface. In some embodiments, the second surface may additionally comprise hydrogen (—H) terminations, such as an HF dipped Si or HF dipped Ge surface. In such embodiments, the surface of interest will be considered to comprise both the —H terminations and the material beneath the —H terminations. In some embodiments, an organic material such as a polyamic acid or polyimide is selectively deposited on a first dielectric surface of a substrate relative to a second, different dielectric surface. In some such embodiments, the dielectrics have different compositions (e.g., silicon, silicon nitride, carbon, silicon oxide, silicon oxynitride, germanium oxide). In other such embodiments, the dielectrics can have the same basic composition (e.g., silicon oxide-based layers) but different material properties due to the manner of formation (e.g., thermal oxides, native oxides, deposited oxides). In some embodiments, vapor deposition methods are used. In some embodiments, cyclical vapor deposition is used, for example, cyclical CVD or atomic layer deposition (ALD) processes are used. After selective deposition of the organic material is completed, further processing can be carried out to form the desired structures. Advantageously, selectivity can be achieved without blocking agents on the surface to receive less of the organic layer; and/or without catalytic agents on the surface to receive more of the organic layer. However, in some embodiments, blocking agents that prevent or reduce the deposition of the organic layer on the second surface are used.

For embodiments in which one surface of the substrate comprises a metal, the surface is referred to as a metal surface. It may be a metal surface or a metallic surface. In some embodiments the metal or metallic surface may comprise metal, metal oxides, and/or mixtures thereof. In some embodiments the metal or metallic surface may comprise surface oxidation. In some embodiments the metal or metallic material of the metal or metallic surface is electrically conductive with or without surface oxidation. In some embodiments, metal or a metallic surface comprises one or more transition metals. In some embodiments, the metal or metallic surface comprises one or more transition metals from row 4 of the periodic table of elements. In some embodiments, the metal or metallic surface comprises one or more transition metals from groups 4 to 11 of the periodic table of elements. In some embodiments, a metal or metallic surface comprises aluminum (Al). In some embodiments, a metal or metallic surface comprises copper (Cu). In some embodiments, a metal or metallic surface comprises tungsten (W). In some embodiments, a metal or metallic surface comprises cobalt (Co). In some embodiments, a metal or metallic surface comprises nickel (Ni). In some embodiments, a metal or metallic surface comprises niobium (Nb). In some embodiments, the metal or metallic surface comprises iron (Fe). In some embodiments, the metal or metallic surface comprises molybdenum (Mo). In some embodiments, a metal or metallic surface comprises a metal selected from a group consisting of Al, Mn, Fe, Co, Ni, Cu, Zn, Nb, Mo, Ru and W. In some embodiments, the metal or metallic surface comprises a transition metal selected from a group consisting of Zn, Fe, Mn and Mo.

In some embodiments, a metallic surface comprises titanium nitride. In some embodiments, the metal or metallic surface comprises one or more noble metals, such as Ru. In some embodiments, the metal or metallic surface comprises a conductive metal oxide. In some embodiments, the metal or metallic surface comprises a conductive metal nitride. In some embodiments, the metal or metallic surface comprises a conductive metal carbide. In some embodiments, the metal or metallic surface comprises a conductive metal boride. In some embodiments, the metal or metallic surface comprises a combination conductive materials. For example, the metal or metallic surface may comprise one or more of RuOx, NbCx, NbBx, NiOx, CoOx, NbOx, WNCx, TaN, or TiN.

In some embodiments the metal or metallic surface may be any surface that can accept or coordinate with the first or second precursor utilized in a selective deposition process as described herein.

In some embodiments, an organic material is selectively deposited on a metal oxide surface relative to another surface. A metal oxide surface may be, for example a WOx, HfOx, TiOx, AlOx or ZrOx surface. In some embodiments, a metal oxide surface is an oxidized surface of a metallic material. In some embodiments, a metal oxide surface is created by oxidizing at least the surface of a metallic material using oxygen compound, such as compounds comprising $O_3$, $H_2O$, $H_2O_2$, $O_2$, oxygen atoms, plasma or radicals or mixtures thereof. In some embodiments, a metal oxide surface is a native oxide formed on a metallic material.

In some embodiments, the first surface may comprise a passivated metal surface, for example a passivated Cu surface. That is, in some embodiments, the first surface may comprise a metal surface comprising a passivation layer, for example an organic passivation layer such as a benzotriazole (BTA) layer.

In some embodiments, an organic material is selectively deposited on a first dielectric surface relative to a second $SiO_2$ surface. In some embodiments, an organic material is selectively deposited on a first dielectric surface relative to a second Si or Ge surface, for example an HF-dipped Si or HF-dipped Ge surface.

In some embodiments, an organic material is selectively deposited on a first metal or metallic surface of a substrate relative to a second dielectric surface of the substrate. In some embodiments, the first surface comprises a metal oxide, elemental metal, or metallic surface. In some embodiments, the organic material that is selectively deposited is a polyamic acid, polyimide, or other polymeric material. The term dielectric is used in the description herein for the sake of simplicity in distinguishing from the other surface, namely the metal or metallic surface. It will be understood by the skilled artisan that not all non-conducting surfaces are dielectric surfaces. For example, the metal or metallic surface may comprise an oxidized metal surface that is electrically non-conducting or has a very high resistivity. Selective deposition processes taught herein can deposit on such non-conductive metallic surfaces with minimal deposition on adjacent dielectric surfaces.

In some embodiments, an organic material is selectively deposited on a first metal oxide surface of a substrate relative to a second $SiO_2$ surface. In some embodiment the first metal oxide surface may be, for example a WOx, HfOx, TiOx, AlOx or ZrOx surface. In some embodiments, the second $SiO_2$ surface may be, for example, a native oxide, a thermal oxide or a chemical oxide. In some embodiments, an organic material is selectively deposited on a first metal oxide surface relative to a second Si or Ge surface, for example an HF-dipped Si or HF-dipped Ge surface.

In some embodiments, a substrate is provided comprising a first metal or metallic surface and a second dielectric surface. In some embodiments, a substrate is provided that comprises a first metal oxide surface. In some embodiments, the second surface may comprise —OH groups. In some embodiments, the second surface may be a $SiO_2$ based surface. In some embodiments, the second surface may comprise Si—O bonds. In some embodiments, the second surface may comprise a $SiO_2$-based low-k material. In some embodiments, the second surface may comprise more than about 30%, preferably more than about 50% of $SiO_2$. In some embodiments, the second surface may comprise $GeO_2$. In some embodiments, the second surface may comprise Ge—O bonds. In some embodiments, an organic material is selectively deposited on a first metal or metallic surface relative to a second Si or Ge surface, for example an HF-dipped Si or HF-dipped Ge surface.

In certain embodiments the first surface may comprise a silicon dioxide surface and the second dielectric surface may comprise a second, different silicon dioxide surface. For example, in some embodiments, the first surface may comprise a naturally or chemically grown silicon dioxide surface. In some embodiments, the second surface may comprise a thermally grown silicon dioxide surface. In other embodiments, the first or the second surface may be replaced with a deposited silicon oxide layer. Therefore, in some embodiments, organic material may be selectively deposited on a first silicon dioxide surface of a substrate relative to a second silicon dioxide surface that was formed by a different technique and therefore has different material properties.

In some embodiments, the substrate may be pretreated or cleaned prior to or at the beginning of the selective deposition process. In some embodiments, the substrate may be subjected to a plasma cleaning process at prior to or at the beginning of the selective deposition process. In some embodiments, a plasma cleaning process may not include ion bombardment, or may include relatively small amounts of ion bombardment. For example, in some embodiments, the substrate surface may be exposed to plasma, radicals, excited species, and/or atomic species prior to or at the beginning of the selective deposition process. In some embodiments, the substrate surface may be exposed to hydrogen plasma, radicals, or atomic species prior to or at the beginning of the selective deposition process. In some embodiments, a pretreatment or cleaning process may be carried out in the same reaction chamber as a selective deposition process. However in some embodiments, a pretreatment or cleaning process may be carried out in a separate reaction chamber.

In some embodiments, a blocking agent, such as silylating agent, is used to block the second surface before depositing the organic material on the first surface. In some embodiments, a second surface, such as an oxide surface, on a substrate is blocked by silylation with a silylating agent such as alyltrimethylsilane (TMS-A), chlorotrimethylsilane (TMS-Cl), N-(trimenthylsilyl)imidazole (TMS-Im), octadecyltrichlorosilane (ODTCS), hexamethyldisilazane (HMDS), or N-(trimethylsilyl)dimethylamine (TMSDMA) and organic material is selectively deposited on a first surface of the same substrate. The substrate may be contacted with a sufficient quantity of the blocking agent and for a sufficient period of time that the second surface is selectively blocked with silicon species.

Deposition Processes

Selective deposition using the methods described herein can advantageously be achieved without treatment of the second dielectric surface to block deposition thereon and/or without treatment of the first surface (whether metallic or a different dielectric surface) to catalyze deposition. As a result, in some embodiments, the second dielectric surface does not comprise a passivation or blocking layer, such as a self-assembled monolayer (SAM), which would prevent the actual top surface of the second dielectric surface from being exposed to the chemicals of the deposition processes described herein. Thus, in some embodiments, selectivity is achieved despite the lack of blocking or catalyzing agents, and both first and second surfaces are directly exposed to the deposition precursors. Even in material pairs for which selectivity is not perfect, etch-back or similar corrective treatments using, for example, plasma, may allow selective deposition of organic material.

Vapor-phase deposition techniques can be applied to organic layers and polymers such as polyimide films, polyamide films, polyurea films, polyurethane films, polythiophene films, and more. CVD of polymer films can produce greater thickness control, mechanical flexibility, conformal coverage, and biocompatibility as compared to the application of liquid precursor. Sequential deposition processing of polymers can produce high growth rates in small research scale reactors. Similar to CVD, sequential deposition processes can produce greater thickness control, mechanical flexibility, and conformality.

In some embodiments, the cyclic deposition process according to the current disclosure comprises a thermal deposition process. In thermal deposition, the chemical reactions are promoted by increased temperature relevant to ambient temperature. Generally, temperature increase provides the energy needed for the formation of organic material in the absence of other external energy sources, such as plasma, radicals, or other forms of radiation.

In the current disclosure, the deposition process may comprise a cyclic deposition process, such as an atomic layer deposition (ALD) process, a cyclic chemical vapor deposition (VCD) process, molecular layer deposition (MLD), or hybrids thereof irrespective of the reaction mechanism. The term "cyclic deposition process" (or sequential deposition) can refer to the sequential introduction of precursor(s) and/or reactant(s) into a reaction chamber to deposit material, such as organic material, for example polyimide or polyamic acid, on a substrate. Cyclic deposition includes processing techniques such as atomic layer deposition (ALD), cyclic chemical vapor deposition (cyclic CVD), and hybrid cyclic deposition processes that include an ALD component and a cyclic CVD component. The process may comprise a purge step between providing precursors into the reaction chamber.

As used herein, the term "purge" may refer to a procedure in which vapor-phase precursors and/or vapor-phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

The process may comprise one or more cyclic phases. For example, pulsing of first precursor and second precursor may be repeated. In some embodiments, the process comprises or one or more acyclic phases. In some embodiments, the deposition process comprises the continuous flow of at least one precursor. In some embodiments, a precursor may be continuously provided in the reaction chamber. In such an embodiment, the process comprises a continuous flow of a precursor or a reactant. In some embodiments, one or more of the precursors and/or reactants are provided in the reaction chamber continuously.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, another precursor or a reactant may subsequently be introduced into the process chamber for use in converting the chemisorbed precursor to the desired material on the deposition surface. The second precursor or a reactant can be capable of further reaction with the precursor. Purging steps may be utilized during one or more cycles, e.g., during each step of each cycle, to remove any excess precursor from the process chamber and/or remove any excess precursor and/or reaction byproducts from the reaction chamber. Thus, in some embodiments, the cyclic deposition process comprises purging the reaction chamber after providing a first precursor into the reaction chamber. In some embodiments, the cyclic deposition process comprises purging the reaction chamber after providing a second precursor into the reaction chamber.

CVD type processes typically involve gas phase reactions between two or more precursors and/or reactants. The precursor(s) and reactant(s) can be provided simultaneously to the reaction space or substrate, or in partially or completely separated pulses. The substrate and/or reaction space can be heated to promote the reaction between the gaseous precursor and/or reactants. In some embodiments the precursor(s) and reactant(s) are provided until a layer having a desired thickness is deposited. In some embodiments, cyclic CVD processes can be used with multiple cycles to deposit a thin film having a desired thickness. In cyclic CVD processes, the precursors and/or reactants may be provided to the reaction chamber in pulses that do not overlap, or that partially or completely overlap. In some embodiments, the first precursor is supplied in pulses, the second precursor supplied in pulses and the reaction chamber is purged between consecutive pulses of first precursor and second precursor.

In some embodiments, the processes described herein may be batch processes, that is, the processes may be carried out on two or more substrates at the same time. In some embodiments, the processes described herein may be carried out on two or more, five or more, 10 or more, 25 or more, 50 or more, or 100 or more substrates at the same time. In some embodiments, the substrate may comprise wafers, for example, semiconductor or silicon wafers. In some embodiments, the substrates may have diameters of 100 mm or more, 200 mm or more, or 300 mm or more. In some instances, substrates having diameters of 450 mm or more may be desirable.

Selectivity

Selectivity can be given as a percentage calculated by [(deposition on first surface)−(deposition on second surface)]/(deposition on the first surface). Deposition can be measured in any of a variety of ways. In some embodiments, deposition may be given as the measured thickness of the deposited material. In some embodiments, deposition may be given as the measured amount of material deposited.

In some embodiments, selectivity is greater than about 30%, greater than about 50%, greater than about 75%, greater than about 85%, greater than about 90%, greater than about 93%, greater than about 95%, greater than about 98%, greater than about 99% or even greater than about 99.5%. In some embodiments, the organic material is deposited on the first surface relative to the second surface with a selectivity of above about 50%. In embodiments described herein, the selectivity can change over the duration or thickness of a deposition. In some embodiments, selectivity increases with the duration of the deposition for the vapor-phase polymer depositions described herein. In contrast, typical selective deposition based on differential nucleation on different surfaces tends to become less selective with greater duration or thickness of a deposition.

In some embodiments, deposition occurs substantially only on the first surface and does not occur on the second surface. In some embodiments, deposition on the first surface of the substrate relative to the second surface of the substrate is at least about 80% selective, which may be selective enough for some particular applications. In some embodiments, the deposition on the first surface of the substrate relative to the second surface of the substrate is at least about 50% selective, which may be selective enough for some particular applications. In some embodiments, the deposition on the first surface of the substrate relative to the second surface of the substrate is at least about 10% selective, which may be selective enough for some particular applications.

In some embodiments, the organic film deposited on the first surface of the substrate may have a thickness less than about 50 nm, less than about 20 nm, less than about 10 nm, less than about 5 nm, less than about 3 nm, less than about 2 nm, or less than about 1 nm. In some embodiments, a ratio of material deposited on the first surface of the substrate relative to the second surface of the substrate may be greater than or equal to about 2:1, greater than or equal to about 20:1, greater than or equal to about 15:1, greater than or equal to about 10:1, greater than or equal to about 5:1, or greater than or equal to about 3:1.

In some embodiments, the selectivity of the selective deposition processes described herein may depend on the materials which comprise the first and/or second surface of the substrate. For example, in some embodiments, where the first surface comprises a Cu surface and the second surface comprises a low k material, the selectivity may be greater than about 8:1 or greater than about 15:1. In some embodiments, where the first surface comprises a metal or metal oxide and the second surface comprises a natural or chemical silicon dioxide surface the selectivity may be greater than about 5:1 or greater than about 10:1. In some embodiments, where the first surface comprises a chemical or natural silicon dioxide surface and the second surface comprises a thermal silicon dioxide surface the selectivity may be greater than about 5:1 or greater than about 10:1. In some embodiments, where the first surface comprises natural or chemical silicon dioxide, and the second surface comprises Si—H terminations, for example an HF dipped Si surface, the selectivity may be greater than about 5:1 or greater than about 10:1. In some embodiments, where the first surface comprises Si—H terminations, for example an HF dipped Si surface, and the second surface comprises thermal silicon dioxide, the selectivity may be greater than about 5:1 or greater than about 10:1.

Selective Deposition

In some embodiments, a substrate comprising a first surface and a second surface is provided. The first and second surfaces may have different material properties. In some embodiments, the first surface may be a metallic surface and the second surface may be a dielectric surface. In some embodiments, a first organic precursor is vaporized to form a first precursor vapor. The precursor being vaporized may be liquid or solid under standard temperature and pressure conditions (room temperature and atmospheric pressure). In some embodiments, the first precursor is a liquid precursor under standard conditions. In some embodiments, the precursor being vaporized comprises a diamine, such as 1,3-diaminopentane (1,3-DAP). The substrate is then exposed to the first precursor vapor. The substrate is also exposed to a second vapor-phase precursor, for example an organic precursor, such as a dianhydride. A dianhydride may be, for example, pyromellitic dianhydride (PMDA). The cyclic exposure of the substrate to the two precursors leads to the deposition of an organic material. The method can include additional steps, and may be repeated, but need not be performed in the illustrated sequence nor the same sequence in each repetition, and can be readily extended to more complex vapor deposition techniques.

The diamine according to the current disclosure may comprise at least five carbon atoms. However, in some embodiments, a diamine according to the current comprises four carbons. For example, a diamine according to the current disclosure may be selected from 1,2-diaminobutane, 1,3-diaminobutane and 2,4-diaminobutane. Thus, in the four-carbon embodiments, at least one of the amino groups is attached to a carbon atom that is bonded to two other carbon atoms. In other words, at least one of the amino groups is not located at the end of a carbon chain.

In some embodiments, the carbon chain is branched. Thus, there is at least one carbon atom which is bonded to three or four other carbon atoms. In some embodiments, there is one such branching position in the diamine compound. In some embodiments, there are two such branching positions in the diamine compound. In some embodiments, there are three or more branching points. In some embodiments, the side chain from the longer carbon chain is a methyl group. In some embodiments, the side chain from the longer carbon chain is an ethyl group. In some embodiments, the side chain from the longer carbon chain is a propyl group. In some embodiments, the side chain from the longer carbon chain is an isopropyl group. In some embodiments, the side chain from the longer carbon chain is a butyl group. In some embodiments, the side chain from the longer carbon chain is a tert-butyl group. In some embodiments, a side chain of a diamine compound is a straight alkyl chain. In some embodiments, a side chain of a diamine compound is a branched alkyl chain. In some embodiments, a side chain of a diamine compound is a cyclic alkyl chain.

In some embodiments, the diamine compound is a C5 to C11 compound. The number of carbon atoms in the diamine compound typically influences the volatility of the compound such that a higher-weight compound may not be as volatile as a smaller compound. However, it was found out that intermediate-sized diamine compounds containing at least five carbon atoms, may have suitable properties for being used as a diamine precursor in the selective deposition processes according to the current disclosure. For example, 1,3-diaminopentane is liquid at room temperature, has a boiling point of 164° C. under atmospheric pressure, a vapor pressure of about 2.22 Torr at 25° C. and reaches a vapor pressure of 1 Torr at temperatures below 20° C. Thus, when 1,3-diaminopentane (1,3-DAP) is used as a precursor for organic material deposition according to the current disclosure, the precursor vessel does not need to be heated. This may be advantageous for the on-tool lifetime of the precursor, as it may be less prone to degradation during continued use. Further, a liquid precursor has an advantage that precursor vessel loading is less expensive than for solid precursors. In some embodiments, the first precursor comprises 1,3-DAP.

In some embodiments of the disclosure, the amine groups are attached to non-adjacent carbon atoms. This may have advantages for the availability for the amine groups to reactions with the second precursor. In some embodiments, there is one carbon atom between the amino group-binding carbon atoms. In some embodiments, there is at least one carbon atom between the amino group-binding carbon atoms. In some embodiments, there are two carbon atoms between the amino group-binding carbon atoms. In some embodiments, there are at least two carbon atoms between the amino group-binding carbon atoms. In some embodiments, there are three carbon atoms between the amino group-binding carbon atoms. In some embodiments, there are at least three carbon atoms between the amino group-binding carbon atoms. In some embodiments, there are four carbon atoms between the amino group-binding carbon atoms. In some embodiments, there are at least four carbon atoms between the amino group-binding carbon atoms.

In some embodiments, the first precursor comprises 1,5-diamino-2-methylpentane. Although the vapor pressure of 1,5-diamino-2-methylpentane is lower than that of 1,3-diaminopentane, it is also liquid at ambient temperature, and reaching vapor pressure of 1 Torr requires a moderate temperature of about 40° C.

In some embodiments, a carbon atom bonded with an amine nitrogen in the diamine compound is bonded to at least two carbon atoms. Thus, in some embodiments in which the diamine comprises five or more carbons, at least one of the amino groups is not located at the end of a carbon chain. The structure of the diamine compound affects its properties in a vapor deposition process. Branching of a diamine compound, including the number of branches, and the relative position of the amino groups to the branches, may cause the deposited organic material to have different properties. Without limiting the current disclosure to any specific theory, for example steric factors, may lead to certain reactions being preferred in This may offer the possibility to design a deposition process for a given purpose, taking into account for example the thermal budget, organic material growth speed requirements, necessary degree of selectivity, by using different diamine compounds.

In some embodiments, the diamine is an aromatic diamine. In some embodiments, the aromatic diamine is a diaminobenzene, such as 1,2-diaminobenzene, 1,3-diaminobenzene or 1,4-diaminobenzene. In some embodiments, the aromatic diamine comprises an alkylamino group in at least one position. For example, the alkylamino group may be a C1 to C3 alkylamino group, such as —CH$_2$NH$_2$, —(CH$_2$)$_2$NH$_2$, —(CH$_2$)$_3$NH$_2$, —CH(CH$_3$)NH$_2$ or —CH$_2$CH(CH$_3$)NH$_2$.

In some embodiments, the diamine is selected from a group consisting of 1,3-diaminopentane, 1,4-diaminopentane, 2,4-diaminopentane, 2,4-diamino-2,4-dimethylpentane, 1,5-diamino-2-methylpentane, 1,3-diaminobutane, 1,3-diamino-3-methylbutane, 2,5-diamino-2,5-dimethylhexane, 1,4-diamino-4-methylpentane, 1,3-diaminobutane, 1,5-diaminohexane, 1,3-diaminohexane, 2,5-diaminohexane, 1,3-diamino-5-methylhexane, 4,4,4-trifluoro-1,3-diamino-3-methylbutane, 2,4-diamino-2-methylpentane, and 4-(1-methylethyl)-1,5-diaminohexane, 3-aminobutanamide, 1,3-diamino-2-ethylhexane, 2,7-diamino-2,7-dimethyloctane and 1,3-diaminobenzene and 1,4-diaminobenzene. In some embodiments, the diamine compound comprises a halogen.

In some embodiments, triamines may be used in the deposition of organic material according to the current invention. Providing such molecules may advantageously affect the availability of polymerization sites for the second vapor-phase reactant. The availability of three amine groups in a single molecule, may lead to denser polymer network, which again may reduce the metal migration through the organic material. Such properties may be advantageous in embodiments utilizing the organic material according to the current disclosure as a passivation layer. Examples of suitable triamines include 1,2,3-triaminopropane, triamino butane (with amines in carbons 1,2 and 3 or in carbons 1,2 and 4), triamino pentane (especially with amines in carbons 1 and 5, plus in any one of the carbons 2, 3 or 4). Similarly, triamino hexanes may contain amine groups in carbons 1 and 6, as well as in any one of the positions 2, 3, 4 or 5; triamino heptanes may contain amine groups in carbons 1 and 7, as well as in any one of the positions 2, 3, 4, 5 or 6; and triamino octanes may contain amine groups in carbons 1 and 8, as well as in any one of the positions 2, 3, 4, 5, 6 or 7. Further, branched carbon chains, notably 2-aminomethyl-1,3-diaminopropane, 2-aminomethyl-1,4-diaminobutane (or alternatives having the two amino groups elsewhere in the butane chain), 2-aminomethyl-1,5-diaminopentane (or alternatives having the two amino groups elsewhere in the pentane chain), 3-aminomethyl-1,5-diaminopentane (or alternatives having the two amino groups elsewhere in the pentane chain), 2-aminomethyl-1,6-diaminohexane (or alternatives having the two amino groups elsewhere in the hexane chain), 3-aminomethyl-1,6-diaminohexane (or alternatives having the two amino groups elsewhere in the hexane chain), 3-aminoethyl-1,6-diaminohexane (or alternatives having the two amino groups elsewhere in the hexane chain). Also, an aromatic triamine, such as 1,3,5-triaminobenzene, may be an alternative for certain embodiments.

In some embodiments, the organic film comprises a polymer. In some embodiments, the polymer deposited is a polyimide. In some embodiments, the polymer deposited is a polyamic acid. Thus, in some embodiments, the organic material comprises polyimide. In some embodiments, the organic material consists substantially only of polyimide. In some embodiments, the organic material comprises polyamic acid. In some embodiments, the organic material consists substantially only of amide and polyimide. In some embodiments, the organic material is deposited at temperatures below 190° C., and subsequently heat-treated at a temperature of about 190° C. or higher (such as 200° C. or 210° C.) to increase the proportion of the organic material from polyamic acid to polyimide. Other examples of deposited polymers include dimers, trimers, polyurethanes, polythioureas, polyesters, polyimines, other polymeric forms or mixtures of the above materials.

In some embodiments, the second vapor-phase precursor comprises pyromellitic dianhydride (PMDA).

In some embodiments the substrate is thermally annealed for a period of about 1 to about 15 minutes. In some embodiments the substrate is thermally annealed at a temperature of about 200 to about 500° C. In some embodiments the thermal anneal step comprises two or more steps in which the substrate is thermally annealed for a first period of time at a first temperature and then thermally annealed for a second period of time at a second temperature.

Additional treatments, such as heat or chemical treatment, can be conducted prior to, after or between the processing steps described herein. For example, treatments may modify the surfaces or remove portions of the material on the substrate surfaces exposed at various stages of the process. In some embodiments, the substrate may be pretreated or cleaned prior to or at the beginning of the selective deposition of organic material. In some embodiments, the substrate may be subjected to a plasma cleaning process at prior to or at the beginning of the selective deposition of organic material. In some embodiments, a plasma cleaning process may not include ion bombardment, or may include relatively small amounts of ion bombardment. For example, in some embodiments the substrate surface may be exposed to plasma, radicals, excited species, and/or atomic species prior to or at the beginning of the selective deposition of organic material. In some embodiments, the substrate surface may be exposed to hydrogen plasma, radicals, or atomic species prior to or at the beginning of the selective deposition of organic material. In some embodiments, a pretreatment or cleaning process may be carried out in the same reaction chamber as a selective deposition of organic material, however in some embodiments a pretreatment or cleaning process may be carried out in a separate reaction chamber.

Drawings

The disclosure is further explained by the following exemplary embodiments depicted in the drawings. The illustrations presented herein are not meant to be actual views of any particular material, structure, device or an apparatus, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1A is a schematic representation selective deposition of organic material according to the current disclosure. The substrate 100 comprises a first surface 102 comprising a first material and a second surface 104 comprising a second material. In the exemplary embodiment of FIG. 1A, a substrate 100 comprising a first surface 102 having a first material and a second surface 104 comprising a second material is depicted. The substrate 100 may comprise additional layers below the surface. In panel a), the surface of the substrate is formed by the first surface 102 and second surface 104. The first surface 102 comprises, consist essentially of, or consist of first material. The second surface 104 comprises, consist essentially of, or consist of second material. First material and second material are different materials. In the illustration of FIG. 1A, the first surface 102 and the second surface 104 are on deg C.? the same vertical level. However, in reality, the first and second surfaces 102, 104 could be on different levels.

Figure 1B:
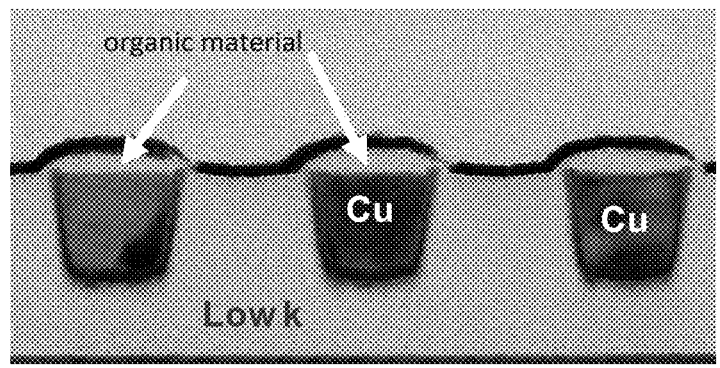

FIG. 1B depicts a cross-sectional scanning transmission electron micrograph showing the thicknesses of selectively deposited organic material on copper surface relative to a low k surface (a SiOC surface). In an exemplary embodiment of the method according to the current disclosure, a polyimide-containing layer was selectively deposited on a silicon wafer having patterned copper (Cu) features alternated with low k surfaces. 1,3-diaminopenatane (1,3-DAP) was used as the first vapor-phase precursor, and PMDA as the second vapor-phase precursor. $N_2$ was used as a carried gas, and the reaction chamber was purged after each precursor. The deposition was performed at a temperature of 190° C., and the 1,3-DAP source vessel was held at ambient temperature, so that the precursor remained in liquid state.

Figure 1C:
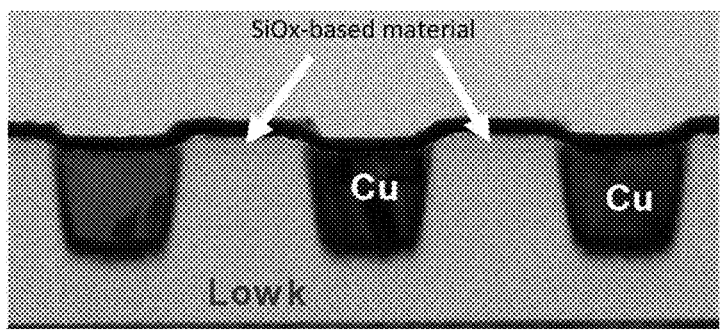

About 7 nm of the polyimide-containing material is deposited on the copper surfaces, whereas only a very thin layer is visible on the low k surface. Some lateral growth (approx. 1 to 2 nm) was observed. An etching step has not been performed for the sample in FIG. 1B, and such a step would improve the selectivity result by removing the polyimide-containing material from the low k material substantially completely. The experiment was continued by depositing silicon oxide-based material (metal-doped silicon oxide) on the low k material, as depicted in FIG. 1C. The silicon oxide is selectively deposited on the low k surface as an approximately 6.5 nm thick layer, and not on the copper surface.

In some embodiments, especially in cases in which the substrate is exposed to air for prolonged periods of time, a preclean may be performed on the substrate to prepare the metal, such as Cu, surface for the deposition of organic material according to the current disclosure. A preclean may also remove any migrated metal particles from the dielectric surface, to prevent or to reduce parasitic deposition of organic material on the dielectric surface. The preclean may comprise reduction and controlled oxidation. In some embodiments, the preclean comprises reducing the metal surface and re-oxidizing it before selective deposition. For example an alcohol, such as ethanol, or plasma, such as $H_2$ plasma, may be used to reduce the metal, such as Cu, surface. The strength of the treatment may be adjusted according to the degree of initial oxidation. The deeper the oxidation, the more stringent reduction treatment needs to be performed. The reduced metal surface is oxidized in a controlled way to a predetermined depth, to allow preparing the metal surface for deposition of an organic material according to the current disclosure through etching the newly formed oxide layer.

In some embodiments, the need for a preclean treatment may be avoided, if an organic layer according to the current disclosure is deposited immediately after the substrate surfaces have been prepared, typically after CMP treatment. The deposited organic material may be heated to at least 250° C., such as from about 250° C. to about 400° C., or from about 300° C. to about 350° C. This may improve its resistance towards the underlying metal, such as Cu, layer from migrating through the material. Such a solution may allow the storage of the prepared substrates, giving more flexibility to design a deposition process flow.

Figure 2A:
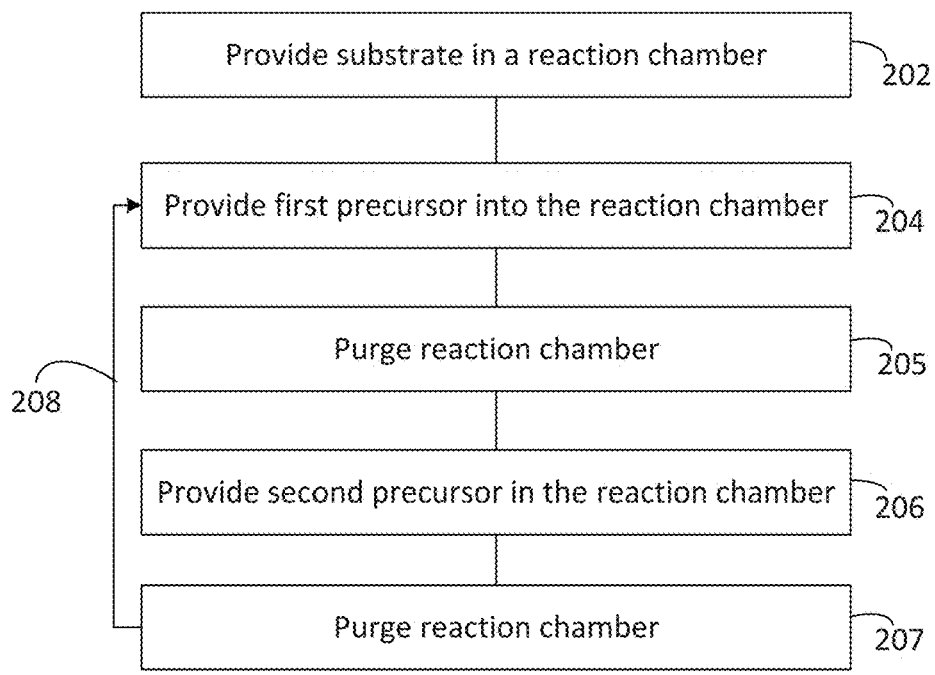
FIGS. 2A and 2B illustrate a block diagram of a process according to the current disclosure.
Figure 2B:
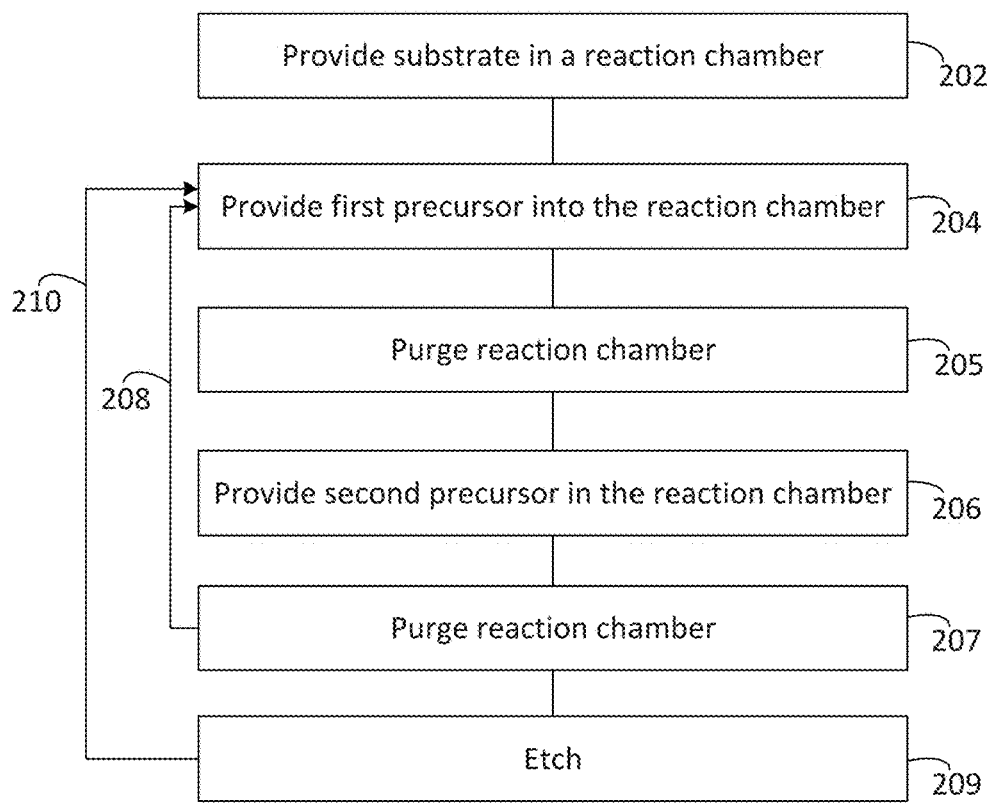

FIGS. 2A and 2B depict an aspect of the current invention in which a layer of organic material is selectively deposited on a substrate comprising a first surface and a second surface by a cyclic deposition process. Referring to FIG. 2A, the process 200 comprises providing a substrate in a reaction chamber at block 202. A substrate according to the current disclosure comprises a first surface and a second surface, and the first and second surfaces have different material properties. In some embodiments, the first surface may be a conductive surface, for example a metal or metallic surface (such as a Cu, Co, W, Mo), and the second surface may be a dielectric surface (such as $SiO_2$, SiOC, SiN, $HfO_2$).

In some embodiments, the second surface comprises an inorganic dielectric surface. In some embodiments, the second surface is an inorganic dielectric surface. In some embodiments, the second surface comprises silicon. In some embodiments, the second surface comprises $SiO_2$. In some embodiments, the second surface comprises a silicon oxide-based material, such as a metal silicate. In some embodiments, the second surface is a high-k surface, such as hafnium oxide surface, a lanthanum oxide surface. In some embodiments, the second surface is an etch-stop layer. An etch-stop layer may comprise, for example a nitride.

In some embodiments, the first surface may be a dielectric surface and the second surface may be a second, different dielectric surface. In some embodiments, the first and second surfaces may have the same basic composition, but may have different material properties due to different manners of formation (e.g., thermal oxide, deposited oxide, native oxide). In some embodiments, the first surface is a silicon-comprising surface and the second surface is a silicon-comprising surface of different composition. For example, the first or the second surface may be a silicon oxide-based surface, such as silicon oxide or a metal silicate-comprising surface, while the other surface is a silicon nitride-based surface.

At block 204, a first vapor-phase precursor is provided into the reaction chamber. A first precursor according to the current disclosure comprises a diamine compound comprising at least five carbon atoms and the amine groups being attached to non-adjacent carbon atoms, and the first precursor is liquid at a temperature of 15-40° C. In the embodiments according to the current disclosure, the amino groups are primary amino groups. Providing a precursor into the reaction chamber leads to contacting the substrate with the precursor. Thus, in an aspect, the process comprises contacting the substrate with a first vapor-phase precursor, and contacting the substrate with a second vapor-phase precursor.

For providing the first precursor into the reaction chamber in vapor phase, the first precursor is vaporized. A first precursor according to the current disclosure may have improved vaporization properties compared to the previously used diamine precursors. In some embodiments, the temperature at which the vapor pressure of the first precursor is 1 Torr is lower than 40° C., or lower than 20° C. In some embodiments, the vapor pressure of a diamine precursor according to the current disclosure is 1 Torr at a temperature of about 40° C. or less. In some embodiments, the vapor pressure of a diamine precursor according to the current disclosure is 1 Torr at a temperature of about 30° C. or less. In some embodiments, the vapor pressure of a diamine precursor according to the current disclosure is 1 Torr at a temperature of about 20° C. or less.

A vapor pressure of approximately 1 Torr may be considered sufficient for vaporizing a precursor. A low temperature at which such vapor pressure is achieved may be advantageous for performing vapor deposition processes. Therefore, reduced need for heating of the first precursor according to the current disclosure may improve its on-tool stability at the evaporation temperature, as well as reduce decomposition during vapor deposition. Stability during deposition may be important in atomic layer deposition-type processes, where self-limiting growth of the deposited material is targeted. A further advantage of higher vapor pressure is that a first precursor according to the current disclosure may be used in vapor deposition processes having a limited thermal budget, broadening the possibilities for selective deposition on sensitive materials.

In some embodiments, the first precursor is vaporized at a first temperature to form the first vapor-phase precursor. In some embodiments, the first precursor vapor is transported to the substrate through a gas line at a second temperature. In some embodiments, the second temperature is higher than the first temperature. In some embodiments, the substrate may be contacted with the first vapor-phase precursor at a third temperature. Thus, the reaction chamber temperature and/or the susceptor temperature may be different than the vaporization temperature and the gas line. In some embodiments, the third temperature is higher than the first temperature. In some embodiments, the third temperature is higher than the second temperature. In some embodiments, the third temperature is higher than the first temperature and the second temperature. In some embodiments, the third temperature is a susceptor temperature. In some embodiments, the third temperature is a susceptor temperature and it is between about 170° C. and 210° C., such as 180° C., 190° C. or 200° C. In some embodiments, the substrate is held at a temperature higher than about 100° C., such as higher than about 150° C., during the deposition process for depositing organic material.

Without limiting the current disclosure to any specific theory, the deposition temperature, such as the reaction chamber temperature or the susceptor temperature, may influence the growth rate of the organic material. For example, when using 1,3-diaminopentane as the first vapor-phase precursor, the organic material growth rate may be from about 1.5 to about 2.1 Å/cycle at a temperature of 160° C., from about 1.1 to about 1.7 Å/cycle at a temperature of 170° C., from about 0.3 to about 0.7 Å/cycle at a temperature of 180° C. and from about 0.05 to about 0.12 Å/cycle at a temperature of 190° C. However, lower growth rate may correlate with some advantageous properties of the resulting organic material, such as polyimide-containing material. For example, the proportion of polyimide to polyamic acid in the material may be larger. A larger proportion of polyimide compared to polyamic acid may make the organic material less sensitive to etching processes, such as plasma etching process (for example hydrogen plasma etching). This again may make the regulation of etch-back or trimming processes easier, leading to a broader selectivity window in area-selective deposition processes. It may also be possible to include plasma step in downstream deposition step or steps, since the organic layer deposited on the first surface may be able to withstand plasma exposure without loss of its desired functionality. Another advantage of lower growth rate of organic material according to the current disclosure may be reduced lateral growth of the organic material. Thus, less of the selectively deposited organic material may grow sideways on unwanted surfaces.

In some embodiments, a first precursor according to the current disclosure is liquid at a temperature between approximately 15° C. and 40° C. Such a precursor may offer advantages in precursor dozing, as the evaporation may be more constant throughout the lifetime of a given precursor vessel. For solid precursors, the dozing may be more difficult to control as the amount of precursor composition in the vessel is reduced during the vessel on-tool time. Solid precursors are also prone to becoming harder and to forming larger particles reducing the precursor surface area and volatilization rate. Further, liquid precursors may offer advantages in precursor vessel maintenance, as the remains of solid precursors may be difficult to remove from the vessel, and thus vessel re-use may become costly. In some embodiments, a first precursor according to the current disclosure is liquid at temperatures above about 15° C. In some embodiments, a first precursor according to the current disclosure is liquid at temperatures of or above about 20° C. In some embodiments, a first precursor according to the current disclosure is liquid at temperatures of or above about 25° C. In some embodiments, a first precursor according to the current disclosure is liquid at temperatures of or above about 30° C. In some embodiments, a first precursor according to the current disclosure is liquid at temperatures of or above about 40° C.

When the first precursor is provided into the reaction chamber at block 204, it will become in contact with the substrate. Without limiting the current disclosure to any specific theory, first precursor may be selectively chemisorbed on the first surface of the substrate relative to the seconds surface of the substrate. In some embodiments, the first vapor-phase precursor is provided into the reaction chamber at block 204 for a first exposure period (first precursor pulse time). In some embodiments, the first precursor pulse time is from about 0.01 seconds to about 60 seconds, about 0.05 seconds to about 30 seconds, about 0.1 seconds to about 10 seconds or about 0.2 seconds to about 5 seconds. The optimum exposure period can be determined experimentally based on the particular circumstances, such as substrate properties and the composition of the first surface and the second surface. In some embodiments, such as embodiments where batch reactors are used, exposure periods of greater than 60 seconds may be employed.

At block 205, the reaction chamber is purged of the first vapor-phase precursor and/or any reaction by-products. This phase of the process may be omitted in some embodiments. However, in many embodiments purging is used. In some embodiments, purging is performed by providing an inert gas, such as a carrier gas, into the reaction chamber for a period of time (purge time). In some embodiments, $N_2$ gas is used in purging. In some embodiments, purge time is from about 0.5 seconds to about 10 seconds, such as from about 1 second to about 5 seconds, for example 1 second, 2 seconds, 4 seconds, 6 seconds or 8 seconds.

At block 206, a second vapor-phase precursor is provided into the reaction chamber. In some embodiments, the second precursor is also an organic reactant capable of reacting with adsorbed species of the first precursor under the deposition conditions. For example, the second precursor can be an anhydride, such as furan-2,5-dione (maleic acid anhydride), or more particularly a dianhydride, e.g., pyromellitic dianhydride (PMDA), or any other monomer with two reactive groups which will react with the first precursor. In some embodiments, the second vapor-phase precursor comprises a dianhydride. In some embodiments, the second vapor-phase precursor comprises PMDA.

In some embodiments, a second vapor-phase precursor is provided into the reaction chamber at block 206 for a second exposure period (second precursor pulse time). In some embodiments, the second precursor may be vaporized at a fourth temperature to form the second vapor-phase precursor. In some embodiments, the second precursor vapor is transported to the substrate through a gas line at a fifth temperature. In some embodiments, the fifth temperature is higher than the first temperature. In some embodiments, the second vapor-phase precursor is provided into the reaction chamber at a sixth temperature that is higher than the fourth temperature. In some embodiments, the sixth temperature is substantially the same as the third temperature.

In some embodiments, the first precursor is provided into the reaction chamber prior to the second precursor being provided into the reaction chamber. Thus, in some embodiments, a diamine comprising at least five carbon atoms and the amine groups being attached to non-adjacent carbon atoms and the diamine being liquid at a temperature of 15° C. to 40° C. is provided into the reaction chamber prior to providing another precursor into the reaction chamber. However, in some embodiments, the second precursor, such as a dianhydride, is provided into the reaction chamber prior to providing the first precursor into the reaction chamber. Thus, in some embodiments, the substrate is contacted with an anhydride, such as furan-2,5-dione (maleic acid anhydride), or more particularly a dianhydride, e.g., pyromellitic dianhydride (PMDA) prior to being contacted with another precursor.

In the method, the first and second vapor-phase precursors form the organic material selectively on the first surface relative to the second surface, and the first vapor-phase precursor comprises a diamine compound comprising at least five carbon atoms and the amine groups are attached to non-adjacent carbon atoms, and the first precursor is liquid at a temperature of 15-40° C. Without limiting the current disclosure to any specific theory, the selectivity may be at least partially due to the preferential chemisorption of the first precursor on the first surface.

In an aspect, the organic material according to the current disclosure forms a layer of organic material. The organic material may comprise polyimide, polyamic acid or both. The deposition methods disclosed herein may result in an advantageous organic material composition. Without limiting the current disclosure to any specific theory, the diamine structures described herein may lead to higher polyimide content relative to polyamic acid in the organic material than the processes known in the art. This again may lead to higher etch resistance. Additionally, in embodiments in which organic material is deposited on copper surfaces, copper migration into the organic material according to the current disclosure may be reduced. This offers advantages in the overall deposition procedure, such as improved passivation properties for the organic material against additional material deposition. In other words, the selectivity of further deposition processes on the second surface relative to the first surface covered by the organic material may be improved.

At block 207, the reaction chamber is purged of the second vapor-phase precursor and/or any reaction by-products. This phase of the process may be omitted in some embodiments. However, in many embodiments purging is used. In some embodiments, purging is performed by providing an inert gas, such as a carrier gas, into the reaction chamber for a period of time (purge time). In some embodiments, $N_2$ gas is used in purging. In some embodiments, purge time is from about 0.5 seconds to about 10 seconds, such as from about 1 second to about 5 seconds, for example 1 second, 2 seconds, 4 seconds, 6 seconds or 8 seconds.

The use of purge phases 205 and 207 is independently optional. Thus, both or either one of the phases 205 and 207 may be performed, and the parameters, such as duration and composition of the purge gas, may be independently selected. In some embodiments, each deposition cycle comprises removing excess of the first vapor-phase precursor and reaction by-products after providing the first vapor-phase precursor into the reaction chamber. In some embodiments, each deposition cycle comprises removing excess of the second vapor-phase precursor and reaction by-products after providing the second vapor-phase precursor into the reaction chamber. However, it is possible that a deposition process comprises one or more cycles in which the purge phase is omitted. Thus, for simplicity, in the context of purging, each deposition cycle may mean "substantially each deposition cycle".

The selective deposition process according to the current disclosure is a cyclic process. The thickness of the deposited organic material layer is determined, in addition to the conditions during providing the first precursor and the second precursor into the reaction chamber, by the number of deposition cycles 208 performed. In some embodiments, a deposition cycle comprises phases 204 and 206. In some embodiments, a deposition cycle comprises phases 204 and 206, as well as one or both of 205 and 207. In some embodiments, a deposition cycle comprises phases 204, 205, 206 and 207. In some embodiments, the first precursor and the second precursor are provided into the reaction chamber alternately and sequentially.

In some embodiments, a deposition cycle may be repeated until an organic layer of a desired thickness is selectively deposited. The selective deposition cycle can include additional acts, need not be in the same sequence nor identically performed in each repetition, and can be readily extended to more complex vapor deposition techniques. For example, a selective deposition cycle can include additional reactant supply processes, such as the supply and removal (relative to the substrate) of additional reactants in each cycle or in selected cycles. Though not shown, the process may additionally comprise treating the deposited film to form a polymer (for example, UV treatment, annealing, etc.).

In some embodiments, the organic material comprises a polyimide. In some embodiments, the organic material comprises a polyamic acid.

FIG. 2B depicts an embodiment in which the method further comprises subjecting the substrate to an etch process 209 subsequent to multiple consecutive deposition cycles. The process is performed as in the embodiment of FIG. 2A, including repeating the deposition cycle according to block 208. The etch process may be performed once at the end of the deposition process, or it can be performed intermittently after a predetermined number of deposition cycles, as depicted by block 210. After an etching process, the selective deposition of organic material may be continued.

In some embodiments, the etch process removes substantially all of any deposited organic material from the second surface of the substrate and does not remove substantially all of the deposited organic material from the first surface of the substrate. In some embodiments, the etch process comprises exposing the substrate to hydrogen atoms, hydrogen radicals, hydrogen plasma, or combinations thereof. In some embodiments, the etch process comprises exposing the substrate to oxygen atoms, oxygen radicals, oxygen plasma, or combinations thereof.

In some embodiments, the substrate may be subjected to an etch process to remove at least a portion of the deposited organic film. In some embodiments, an etch process subsequent to selective deposition of the organic film may remove deposited organic material from both the first surface and the second surface of the substrate. In some embodiments, the etch process may be isotropic.

In some embodiments, the etch process may remove the same amount, or thickness, of organic material from the first and second surfaces. That is, in some embodiments, the etch rate of the organic material deposited on the first surface may be substantially similar to the etch rate of the organic material deposited on the second surface. Due to the selective nature of the deposition processes described herein, the amount of organic material deposited on the second surface of the substrate may be substantially less than the amount of material deposited on the first surface of the substrate. Therefore, an etch process may completely remove deposited organic material from the second surface of the substrate while deposited organic material may remain on the first surface of the substrate.

In some embodiments, the etch process may comprise an etch process known in the art, for example a dry etch process such as a plasma etch process. In some embodiments, the etch process may comprise exposing the substrate to hydrogen atoms, hydrogen radicals, hydrogen plasma, or combinations thereof. For example, In some embodiments, the etch process may comprise exposing the substrate to a plasma generated from $H_2$ using a power from about 10 W to about 5000 W, from about 25 W to about 2500 W, from about 50 W to about 500 W, or preferably from about 100 W to about 400 W.

The diamine compounds according to the current disclosure may be used to deposit organic material that is more resistant to an etch process, for example to an etch process performed by hydrogen plasma as an etchant. This may be advantageous, as it may allow for easier tuning of an etching process, which again may enable a broader selectivity window.

In some embodiments, the etch process may comprise exposing the substrate to a plasma. In some embodiments, the plasma may comprise oxygen atoms, oxygen radicals, oxygen plasma, or combinations thereof. In some embodiments, the plasma may comprise hydrogen atoms, hydrogen radicals, hydrogen plasma, or combinations thereof. In some embodiments, the plasma may also comprise noble gas species, for example Ar or He species. In some embodiments, the plasma may consist essentially of noble gas species. In some embodiments, the plasma may comprise other species, for example nitrogen atoms, nitrogen radicals, nitrogen plasma, or combinations thereof. In some embodiments, the etch process may comprise exposing the substrate to an etchant comprising oxygen, for example $O_3$. In some embodiments, the substrate may be exposed to an etchant at a temperature of between about 30° C. and about 500° C., for example between about 100° C. and about 400° C. In some embodiments, the etchant may be supplied in one continuous pulse or may be supplied in multiple shorter pulses. A purge phase may be performed between etching pulses.

FIG. 3 depicts an aspect of the current disclosure in which inorganic material is selectively deposited on a second surface 304 of a substrate 300 relative to first a surface 302 of the substrate 300. At phase a) the substrate 300 is provided. The substrate may be provided in a reaction chamber. Organic material, such as polyimide-containing material, is deposited on the first surface 302 of the substrate 300 at phase b). The deposition process for depositing a layer of organic material on the first surface 302 of the substrate 300 comprises providing a first vapor-phase precursor in the reaction chamber, and providing a second vapor-phase precursor in the reaction chamber. The first and second vapor-phase precursors form the organic material selectively on the first surface 302 relative to the second surface 304, wherein the first vapor-phase precursor comprises a diamine compound comprising at least five carbon atoms and the amine groups being attached to non-adjacent carbon atoms, and wherein the first precursor is liquid at a temperature of about 15° C. to about 40° C. Next, at phase c), the inorganic material is deposited on the second surface 304. In some embodiments, the deposition of the inorganic material may be performed by a cyclic deposition process, such as ALD or cyclic CVD. In some embodiments, the deposited inorganic material is a metal material, metallic material, a dielectric material or a combination thereof. In some embodiments, the deposited inorganic material is aluminum oxide. In some embodiments, the deposited inorganic material is silicon-containing material. In some embodiments, the silicon-containing material is $SiO_2$, SiOC, SiN, metal silicate-comprising material or a combination thereof. For example, the deposited inorganic material may be yttrium-doped silicon oxide. In some embodiments, the deposited inorganic material is an oxide material. In some embodiments, the deposited material may be yttrium oxide-comprising material, zirconium oxide-comprising material, hafnium oxide-comprising material or a combination thereof. In some embodiments, the deposited inorganic material forms an etch-stop layer.

At phase d) of FIG. 3, the organic material deposited on the first surface 302 is removed, leaving the deposited inorganic material on the second surface 304 and the original material of the first surface 302 as the topmost surfaces of the substrate. The above-mentioned phases can be followed by additional processing steps known in the art.

Figure 4:
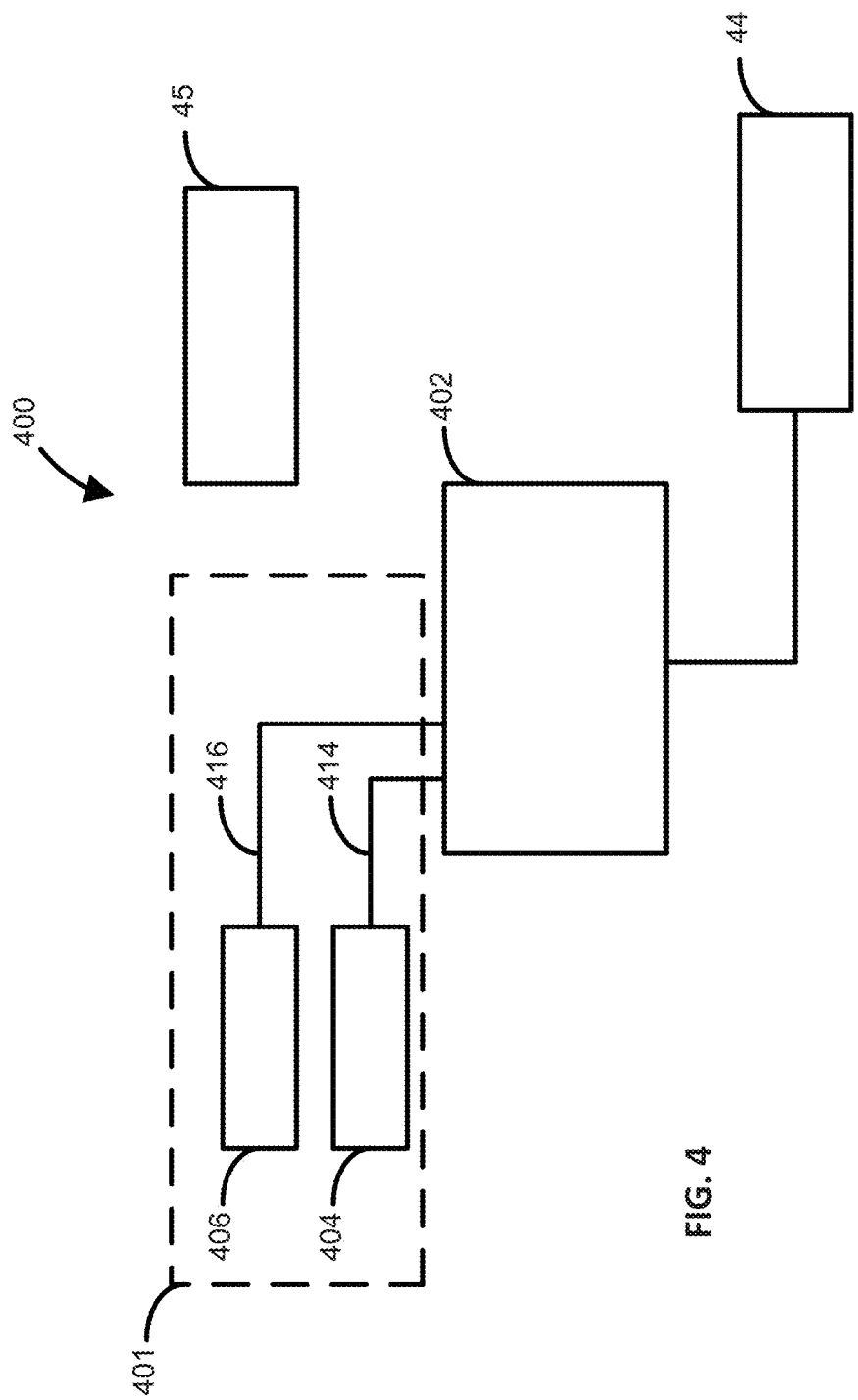
FIG. 4 Is a schematic presentation of a vapor deposition assembly according to the current disclosure.

FIG. 4 illustrates a deposition assembly 400 according to the current disclosure in a schematic manner. Deposition assembly 400 can be used to perform a method as described herein and/or to selectively deposit organic material as described herein.

In the illustrated example, deposition assembly 400 includes one or more reaction chambers 402, a precursor injector system 401, a first precursor vessel 404, a second precursor vessel 406, an exhaust source 44, and a controller 45. The deposition assembly 400 may comprise one or more additional gas sources (not shown), such as an inert gas source, a carrier gas source and/or a purge gas source. Reaction chamber 402 can include any suitable reaction chamber, such as an ALD or CVD reaction chamber as described herein.

The first precursor vessel 404 can include a vessel and one or more first precursors as described herein-alone or mixed with one or more carrier (e.g., inert) gases. A second precursor vessel 406 can include a vessel and one or more second precursors as described herein-alone or mixed with one or more carrier gases. Although illustrated with two source vessels 404, 406, a deposition assembly 400 can include any suitable number of source vessels. Source vessels 404, 406 can be coupled to reaction chamber 402 via lines 414 and 416, which can each include flow controllers, valves, heaters, and the like. In some embodiments, the first precursor in the first precursor vessel 404 and the second precursor in the second precursor vessel 406 may be heated. In some embodiments, a vessel is heated so that a precursor or a reactant reaches a temperature of at least about 30° C. or at least about 40° C. However, in some embodiments, the first precursor vessel is not heated. In some embodiments, the temperature of the first precursor in the first precursor vessel is regulated to be between about 15° C. and about 40° C., for example between about 15° C. and about 25° C.

Exhaust source 310 can include one or more vacuum pumps.

Controller 312 includes electronic circuitry and software to selectively operate valves, manifolds, heaters, pumps and other components included in the deposition assembly 400. Such circuitry and components operate to introduce precursors, reactants and purge gases from the respective sources. Controller 312 can control timing of gas pulse sequences, temperature of the substrate and/or reaction chamber 402, pressure within the reaction chamber 402, and various other operations to provide proper operation of the deposition assembly 400. Controller 312 can include control software to electrically or pneumatically control valves to control flow of precursors, reactants and purge gases into and out of the reaction chamber 402. Controller 312 can include modules such as a software or hardware component, which performs certain tasks. A module may be configured to reside on the addressable storage medium of the control system and be configured to execute one or more processes.

Other configurations of deposition assembly 400 are possible, including different numbers and kinds of precursor and reactant sources. Further, it will be appreciated that there are many arrangements of valves, conduits, precursor sources, and auxiliary reactant sources that may be used to accomplish the goal of selectively and in coordinated manner feeding gases into reaction chamber 402. Further, as a schematic representation of a deposition assembly, many components have been omitted for simplicity of illustration, and such components may include, for example, various valves, manifolds, purifiers, heaters, containers, vents, and/or bypasses.

During operation of deposition assembly 400, substrates, such as semiconductor wafers (not illustrated), are transferred from, e.g., a substrate handling system to reaction chamber 402. Once substrate(s) are transferred to reaction chamber 402, one or more gases from gas sources, such as precursors, reactants, carrier gases, and/or purge gases, are introduced into reaction chamber 402.

In a further aspect, a deposition assembly for selectively depositing a layer of organic material on a substrate is disclosed. The deposition assembly comprises one or more reaction chambers constructed and arranged to hold the substrate, and a precursor injector system constructed and arranged to provide a first precursor and a second precursor into the reaction chamber in a vapor phase. The deposition assembly also comprises a precursor vessel constructed and arranged to contain a first precursor, and the assembly is constructed and arranged to provide the first precursor and the second precursor via the precursor injector system to the reaction chamber to deposit a layer of organic material on the substrate. The first precursor comprises a diamine compound comprising at least five carbon atoms, the amine groups are attached to non-adjacent carbon atoms, and the first precursor is liquid at a temperature of 15-40° C.

Example

Organic material according to the current disclosure was deposited by using 1,3-DAP and PMDA on Cu, Co and native silicon oxide surfaces. The process was run for 100, 200, 500 and 1,000 cycles, and the thickness of the deposited organic material on different surfaces was measured. PMDA source vessel was held at a temperature of 170° C., whereas the 1,3-DAP source remained in room temperature. Depositions were performed at temperatures of 160° C., 170° C., 180° C. and 190° C. The organic material grew selectively on metal surfaces relative to native silicon oxide surfaces.

For example, at a temperature of 190° C., 6.5 nm of organic material was observed on Cu, 4.8 nm on Co and no growth was observed on native silicon oxide after 100 cycles. After 200 cycles, the corresponding values were about 10.9 nm, 4.4 nm and 1.3 nm, after 500 cycles about 25 nm, 12 nm and 3 nm and after 1,000 cycles about 69 nm, 26 nm and 6.4 nm.

The composition of the organic material deposited as above may vary depending on the surface on which it grows. In the conducted experiments, it was observed that on copper surface, the organic material comprises polyamic acid and polyimide. However, on cobalt surface, the organic material is deposited predominantly, or substantially completely, as polyimide. The proportions of polyimide and polyamic acid may vary according to deposition temperature.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method for selectively depositing a layer of organic material on a substrate comprising a first surface and a second surface by a cyclic deposition process, the process comprising:
   providing a substrate in a reaction chamber;
   providing a first vapor-phase precursor in the reaction chamber; and
   providing a second vapor-phase precursor in the reaction chamber,
   wherein the first and second vapor-phase precursors form organic material selectively on the first surface relative to the second surface; and wherein the first vapor-phase precursor comprises a diamine compound comprising at least five carbon atoms and the amine groups being attached to non-adjacent carbon atoms, and wherein the first precursor is liquid at a temperature of 15-40° C.

2. The method of claim 1, wherein the temperature at which vapor pressure of the first precursor is 1 Torr is lower than 40° C., or lower than 20° C.

3. The method of claim 1, wherein the second vapor-phase precursor comprises a dianhydride.

4. The method of claim 1, wherein the organic material comprises a polyimide.

5. The method of claim 1, wherein the organic material comprises a polyamic acid.

6. The method of claim 1, wherein the substrate is held at a temperature higher than about 100° C. during the deposition process.

7. The method of claim 1, wherein the second surface comprises an inorganic dielectric surface.

8. The method of claim 1, wherein the second surface comprises silicon.

9. The method of claim 1, wherein the second surface comprises $SiO_2$.

10. The method of claim 1, wherein the organic material is deposited on the first surface relative to the second surface with a selectivity of above about 50%.

11. The method of claim 1, wherein the first surface comprises a metal oxide, elemental metal, or metallic surface.

12. The method of claim 1, wherein the first surface comprises a metal selected from a group consisting of aluminum, copper, tungsten, cobalt, nickel, niobium, iron, molybdenum, manganese, zinc, ruthenium and vanadium.

13. The method of claim 1, wherein each deposition cycle further comprises removing excess of the first vapor-phase precursor and reaction by-products after providing the first vapor-phase precursor into the reaction chamber.

14. The method of claim 1, wherein each deposition cycle further comprises removing excess of the second vapor-phase precursor and reaction by-products after providing the second vapor-phase precursor into the reaction chamber.

15. The method of claim 1, wherein the diamine compound is a C5 to C11 compound.

16. The method of claim 1, wherein a carbon atom bonded with an amine nitrogen in the diamine compound is bonded to at least two carbon atoms.

17. The method of claim 1, wherein the diamine compound is selected from a group consisting of 1,3-diaminopentane; 1,4-diaminopentane; 2,4-diaminopentane; 2,4-diamino-2,4-dimethylpentane; 1,5-diamino-2-methylpentane; 1,3-diaminobutane; 1,3-diamino-3-methylbutane; 2,5-diamino-2,5-dimethylhexane; 1,4-diamino methylpentane; 1,3-diaminobutane; 1,5-diaminohexane; 1,3-diaminohexane; 2,5-diaminohexane; 1,3-diamino-5-methylhexane; 4,4,4-trifluoro-1,3-diamino methylbutane; 2,4-diamino-2-methylpentane; and 4-(1-methylethyl)-1,5-diaminohexane, 3-aminobutanamide, 1,3-diamino-2-ethylhexane, 2,7-diamino-2,7-dimethyloctane and 1,3-diaminobenzene and 1,4-diaminobenzene.

18. The method of claim 1, wherein the diamine compound comprises a halogen.

19. The method of claim 1, wherein the method comprises a preclean comprising a reduction and an oxidation step before depositing the organic material on the first surface of the substrate.

20. A method for selectively depositing a layer of organic material on a substrate comprising a first surface and a second surface by a cyclic deposition process, the process comprising:
   contacting the substrate with a first vapor-phase precursor; and
   contacting the substrate with a second vapor-phase precursor, wherein
   the first and second vapor-phase precursors form organic material selectively on the first surface relative to the second surface; and wherein the first vapor-phase precursor comprises a diamine comprising at least three carbon atoms and the amine groups being attached to non-adjacent carbon atoms, and wherein the first precursor is liquid at a temperature of 15-40° C.

21. A method of selectively depositing an inorganic material on a second surface of a substrate relative to first a surface of the substrate by a cyclic deposition process, wherein the process comprises
   depositing a layer of organic material on the first surface by
     providing a substrate in a reaction chamber;
     providing a first vapor-phase precursor in the reaction chamber; and
     providing a second vapor-phase precursor in the reaction chamber,
   wherein the first and second vapor-phase precursors form organic material selectively on the first surface relative to the second surface; and wherein the first vapor-phase precursor comprises a diamine compound comprising at least five carbon atoms and the amine groups being attached to non-adjacent carbon atoms; and wherein the first precursor is liquid at a temperature of 15-40° C.; and depositing the inorganic material on the second surface.

* * * * *